United States Patent
Costa et al.

(10) Patent No.: US 7,348,807 B2
(45) Date of Patent: Mar. 25, 2008

(54) ELECTRIC CIRCUIT FOR PROVIDING A SELECTION SIGNAL

(75) Inventors: Vincenzo Costa, Assling (DE); Christian Müller, Woerth (DE)

(73) Assignee: Infineon Technologies AG, Munich (DE)

( * ) Notice: Subject to any disclaimer, the term of this patent is extended or adjusted under 35 U.S.C. 154(b) by 297 days.

(21) Appl. No.: 11/219,633

(22) Filed: Sep. 2, 2005

(65) Prior Publication Data
US 2006/0056254 A1   Mar. 16, 2006

(30) Foreign Application Priority Data
Sep. 14, 2004  (DE) ...................... 10 2004 044 407

(51) Int. Cl.
G01R 19/00 (2006.01)
H03K 5/153 (2006.01)
(52) U.S. Cl. ............................ 327/58; 327/62; 327/65; 327/66; 327/77; 327/89
(58) Field of Classification Search ...................... None
See application file for complete search history.

(56) References Cited

U.S. PATENT DOCUMENTS

| | | | | |
|---|---|---|---|---|
| 5,187,396 | A * | 2/1993 | Armstrong et al. | 327/65 |
| 5,990,716 | A * | 11/1999 | Chen | 327/172 |
| 6,020,768 | A * | 2/2000 | Lim | 327/77 |
| 6,426,664 | B1 * | 7/2002 | Fujiwara | 327/309 |
| 2005/0104628 | A1 * | 5/2005 | Tanzawa et al. | 327/63 |

FOREIGN PATENT DOCUMENTS

DE          197 42 714 A1      4/1999

* cited by examiner

Primary Examiner—Tuan T Lam
(74) Attorney, Agent, or Firm—Maginot, Moore & Beck

(57) ABSTRACT

An electric circuit for providing a selection signal being used to select a control value of a control variable which oscillates, at steady state, about a reference value about a first control value and a second control value with a first period duration comprises a first differential circuit which provides a first current being dependent on a difference between the first control value and the reference value. The electric circuit further comprises a second differential circuit which provides a second current being dependent on a difference between the reference value and the second value and a first node at which a differential current between the first current and the second current is formed. The differential current forms the selection signal indicating if the first control value or the second value is to be selected in order to minimize a difference between the reference signal and control variable. A first current mirror circuit of the electric circuit is connected between the first differential circuit and the first node in order to pass the first current to the first node and a second current mirror circuit and a third current mirror circuit of the electric circuit are connected in series. The second and third current mirror circuits are connected between the second differential circuit and the first node in order to pass the second current to the first node.

8 Claims, 3 Drawing Sheets

ELECTRIC CIRCUIT FOR PROVIDING A SELECTION SIGNAL

BACKGROUND OF THE INVENTION

1. Field of the Invention

The invention relates to a circuit for providing a selection signal for a control value of a control variable which, in a steady state, oscillates, about a reference variable, between a first control value and a second control value with a first period duration.

2. Description of the Related Art

The technical field of the invention relates to the control of one or more components in an electronic circuit or integrated circuit. In this case, a control variable, in particular a digital control variable, for the electronic component or components is controlled to a predeterminable reference variable. The problem of the control system entering, the steady state after a particular stabilization time and of the variable to be controlled or the control variable, for example a voltage for supplying voltage to the electronic component, oscillating back and forth between two control values is known from a multiplicity of such control-engineering circuits. In this case, there generally exists the problem of only one of the two values between which the control variable oscillates having a minimum control difference from the reference variable.

In order to explain the present problems, FIGS. 1a and 1b show a schematic diagram for illustrating the oscillation of a control variable in a steady state. In this case, FIG. 1a illustrates the control variable RG which oscillates about the reference variable RefG as a function of time t. FIG. 1b shows that the maximum amplitude of the oscillation of the control variable RG is in the form of a first control value RW1 and that the minimum amplitude of the control variable RG is in the form of a second control value RW2. The control system thus alternately decides on the first control value RW1 or the second control value RW2. In this case, there exists the problem of the control system not deciding on that control value which has the smallest control difference from the reference variable RefG (the control value RW2 in this case) and instead an unnecessarily large control difference from the reference variable RefG being generated for the control variable RG on account of the first control value RW1 being alternately decided on in the steady state.

SUMMARY OF THE INVENTION

It is an object of the present invention to provide a circuit for minimizing a control difference between a reference variable and a control variable which oscillates about the reference variable in the steady state.

The above object is achieved in accordance with the invention by means of a circuit for providing a selection signal for a control value of a control variable which, in a steady state, oscillates, about a reference variable, between a first control value and a second control value with a first period duration, the circuit having:
- a first differential circuit which provides a first current that is dependent on a difference between the first control value and the reference variable;
- a second differential circuit which provides a second current that is dependent on a difference between the second control value and the reference variable;
- a first node at which a differential current between the first current and the second current is formed, the differential current forming the selection signal which indicates whether the first control value or the second control value is to be selected in order to minimize the control difference;
- a first current mirror circuit which is connected between the first differential circuit and the first node in order to pass the first current to the first node; and
- a second current mirror circuit and a third current mirror circuit which is connected in series with the second current mirror circuit, said second and third current mirror circuits being connected between the second differential circuit and the first node in order to pass the second current to the first node.

Providing the selection signal advantageously makes it possible to control the relevant component (which is to be controlled) using precisely that control value which has the minimum control difference from the reference variable. The control response is thus optimized overall since the control difference is minimized and the steady state is eliminated.

In a restricted version, the inventive circuit has a first transmission gate for providing the first control value, the first transmission gate being clocked with a first clock signal which has the first period duration.

One advantage of this version of the inventive circuit is that the first transmission gate provides the first control value which the control variable assumes in the steady state. Another advantage is that the first clock signal is used to provide the first control value having the same period duration as the control variable.

In another restricted version, the inventive circuit has a second transmission gate for providing the second control value which the control variable assumes in the steady state, the second transmission gate being clocked with a second clock signal which has the first period duration and has been phase-shifted through half a first period duration relative to the first clock signal.

One advantage of this version is that the second transmission gate provides the second control value. Another advantage of this preferred development is that the second control value has the same period duration as the control variable and the first control value and has been phase-shifted through half the first period duration relative to the first control value, with the result that the first control value and the second control value can be provided at a temporal distance of half the first period duration.

In accordance with further restricted version of the inventive circuit, the circuit has a first capacitor for storing the first control value and a second capacitor for storing the second control value.

One advantage of this preferred development is that the first capacitor buffer-stores and thus safeguards the first control value, and the second capacitor buffer-stores and thus safeguards the second control value, for further processing of the first and second control values.

In accordance with another preferred refinement, the first current mirror circuit and the second current mirror circuit are each in the form of an npn current mirror circuit and the third current mirror circuit is in the form of a pnp current mirror circuit.

In accordance with another preferred development, the circuit has a third capacitor for storing the differential current.

One advantage of this version is that, as a result of the third capacitor being used to store the differential current, the selection signal which is formed by the differential current is buffer-stored and is thus safeguarded for further processing.

In accordance with further restricted version of the inventive circuit, the first differential circuit and the second differential circuit each have a bias transistor, with the result that an identical reference-earth current is provided for the first current and for the second current.

One advantage of this version is that, when forming the difference between the first current and the second current in order to generate the differential current, the identical reference-earth current precludes interfering offset currents.

In accordance a further restricted version of the inventive circuit, the control variable, the first control value and the second control value are each in the form of a voltage.

DESCRIPTION OF THE PREFERRED EMBODIMENTS

In all of the Figures, unless specified otherwise, identical or functionally identical elements and signals have been provided with the same reference symbols.

Figure 1A:
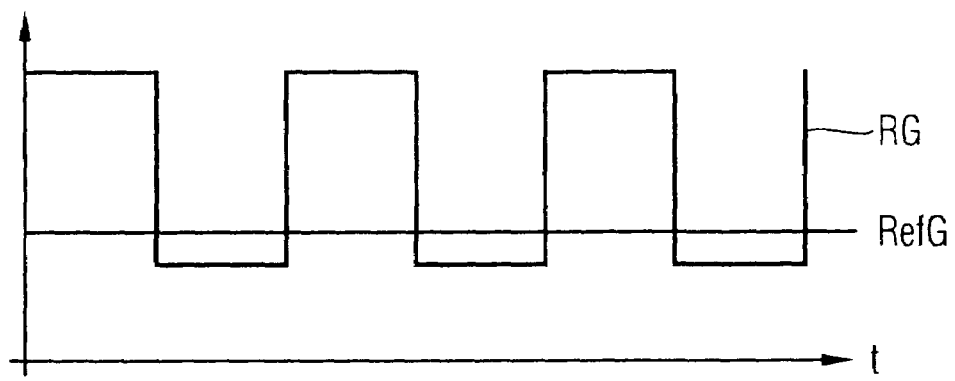
FIGS. 1a, 1b are schematic diagrams for illustrating the oscillation of a control variable in a steady state.
Figure 1B:
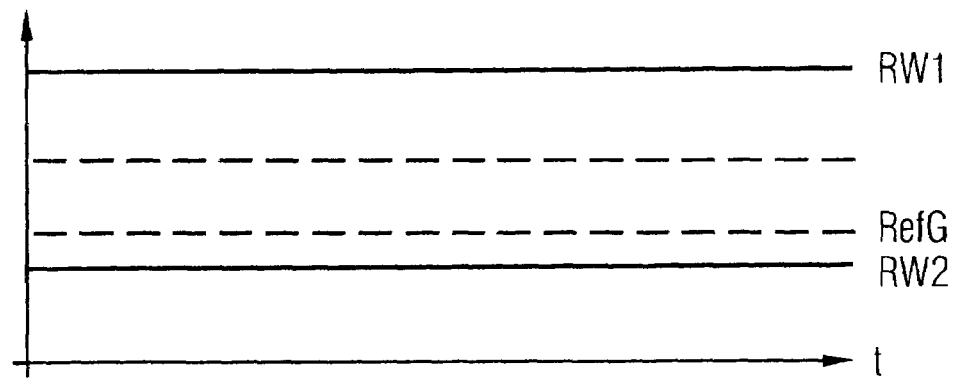
Figure 2:
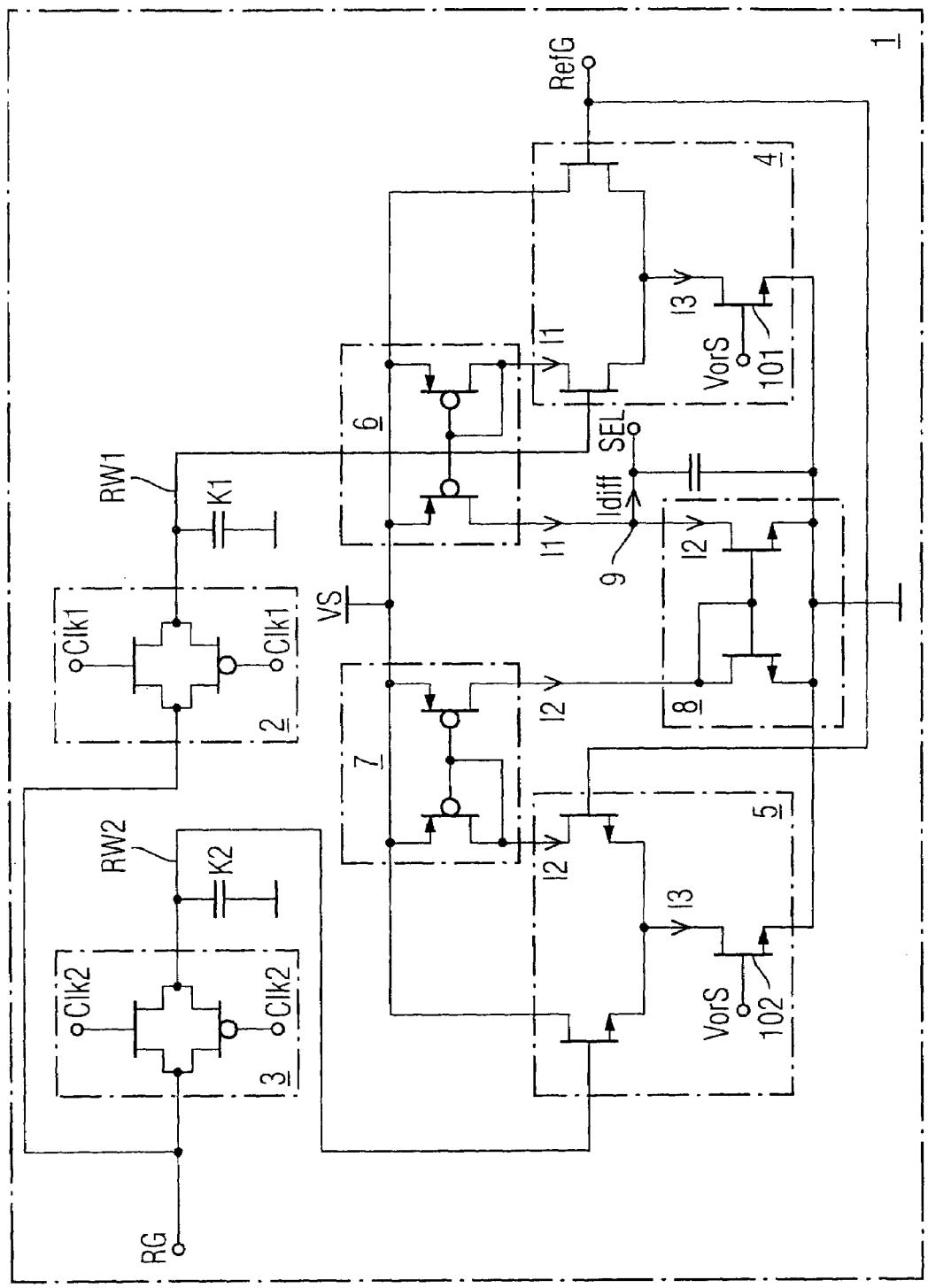
FIG. 2 is a schematic block diagram of a preferred exemplary embodiment of an inventive

FIG. 2 shows a schematic block diagram of one preferred exemplary embodiment of the circuit 1 according to the invention for providing a selection signal SEL for a control value of a control variable RG which, in a steady state, oscillates, about a reference variable RefG, between a first control value RW1 and a second control value RW2 with a first period duration T.

The circuit 1 has a first transmission gate 2 for providing the first control value RW1. The first transmission gate 2 receives the control variable RG on the input side and provides the first control value RW1 on the output side. The first transmission gate 2 is clocked with a first clock signal Clk1 which, like the control variable RG, has the first period duration T.

The circuit 1 also has a second transmission gate 3 for providing the second control value RW2. The second transmission gate 3 receives the control variable RG on the input side and provides the second control value RW2 on the output side. The second transmission gate 3 is clocked with a second clock signal Clk2 which has the first period duration T and has been phase-shifted through half a first period duration T/2 relative to the first clock signal Clk1.

The control variable RG, the first control value RW1 and the second control value RW2 are preferably each in the form of a voltage.

The circuit 1 also has a first differential circuit 4 which provides a first current I1 that is directly proportionally dependent on a difference between the first control value RW1 and the reference variable RefG. The first differential circuit 4 has a bias transistor 101, with the result that a reference-earth current I3 is provided for the first current I1. The equation for the first current I1 therefore results as follows:

$$I1 = \frac{I3}{2} + k(RW1 - RefG), \quad (1)$$

where k is a proportionality constant.

The circuit 1 also has a second differential circuit 5 which provides a second current I2 that is directly proportionally dependent on a difference between the second control value RW2 and the reference variable RefG. The second differential circuit 5 has a bias transistor 102, with the result that a reference-earth current I3 which is identical to that provided for the first current I1 is provided for the second current I2. The equation below therefore results for the second current I2 as follows:

$$I2 = \frac{I3}{2} + k(RefG - RW2) \quad (2)$$

The circuit 1 also has a first current mirror circuit 6 which is connected between the first differential circuit 4 and a first node 9 in order to pass the first current I1 to the first node 9. The first current mirror circuit 6 is preferably in the form of an npn current mirror circuit.

The circuit 1 also has a second current mirror circuit 7 and a third current mirror circuit 8 which is connected in series with the second current mirror circuit 7, said second and third current mirror circuits being connected between the second differential circuit 5 and the first node 9 in order to pass the second current I2 to the first node 9. The second current mirror circuit is preferably in the form of an npn current mirror circuit and the third current mirror circuit 8 is preferably in the form of a pnp current mirror circuit.

The circuit 1 also has the first node 9 at which a differential current Idiff between the first current I1 and the second current I2 is formed. The differential current Idiff forms the selection signal SEL which indicates whether the first control value RW1 or the second control value RW2 is to be selected in order to minimize the control difference.

The identical reference-earth current I3 when subsequently forming the difference between the first current I1 and the second current I2 eliminates potential interfering offset currents.

The differential current Idiff is calculated from the difference between the equations (2) and (1):

$$Idiff = I1 - I2 = \frac{I3}{2} + k(RW1 - RefG) - \left[\frac{I3}{2} + k(RefG - RW2)\right] \quad (3)$$

$$Idiff = RW1 + RW2 - 2RefG$$

The following relationship results for the differential current Idiff:

$$Idiff > 0 \rightarrow RW1 + RW2 - 2RefG > 0 \rightarrow \frac{RW1 + RW2}{2} > Vref \quad (4)$$

The decision as to which control value is decided on is rendered more straightforward using the following definition of a mean value MW.

$$\frac{RW1 + RW2}{2} = MW \quad (5)$$

If the differential current Idiff is greater than 0 (cf. equations (4) and (5)), the mean value MW is also greater than the reference variable RefG. The selection signal SEL is thus to be set to 1, for example, and the first control value RW1 is to be selected as the control value. However, if the differential current Idiff is less than 0, the mean value MW is less than the reference variable RefG and the selection signal SEL is to be set to 0 in accordance with the above example. The second control value RW2 is thus to be selected. The following relationship may be represented in shortened form using the algorithm below:

IF Idiff>0 (6)

THEN MW>RefG→SEL=1→RW1

ELSE MW<RefG→SEL=0→RW2

The circuit 1 thus provides the selection signal SEL which is used to select which of the two control values is to be selected in order to minimize the control difference.

Figure 3:
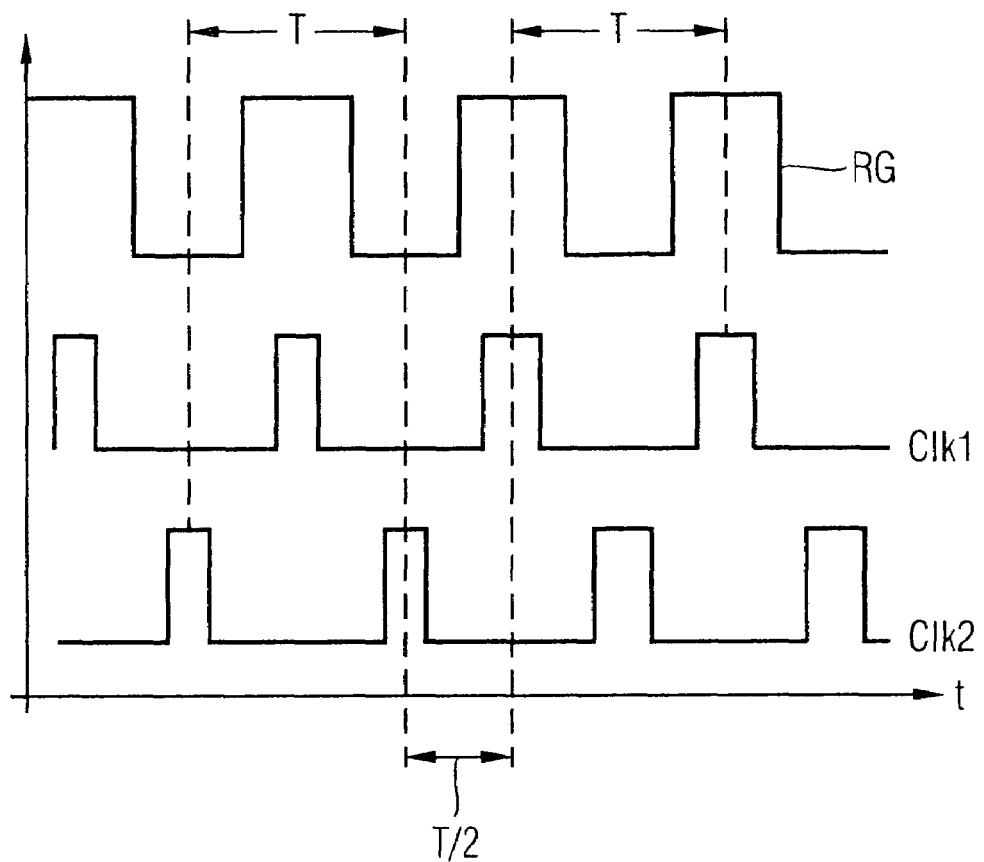
FIG. 3 is a schematic diagram for generating the first and second clock signals according to the present invention.

FIG. 3 shows a schematic diagram for generating the first and second clock signals according to the present invention. The first clock signal CLK1 and the second clock signal CLK2 are derived from the oscillating control variable RG. In the steady state, the control variable RG oscillates with a first period duration T. The first transmission gate 2 is used to derive the first clock signal CLK1 from the maximum values of the control variable RG. The second transmission gate 3 is used to derive the second clock signal CLK2 from the minimum values of the control variable RG. Like the control variable RG, the first clock signal CLK1 and the second clock signal CLK2 have a first period duration T. The second clock signal CLK2 has been phase-shifted through half a first period duration T/2 relative to the first clock signal CLK1.

Although modifications and changes may be suggested by those skilled in the art, it is the intention of the inventors to embody within the patent warranted heron all changes and modifications as reasonably and properly come within the scope of their contribution to the art.

We claim as our invention:

1. Electric circuit for providing a selection signal being used to select a control value of a control variable which oscillates, at steady state, about a reference value about a first control value and a second control value with a first period duration; said electric circuit comprising:

a first differential circuit which provides a first current being dependent on a difference between said first control value and said reference value;

a second differential circuit which provides a second current being dependent on a difference between said reference value and said second control value;

a first node at which a differential current between said first current and said second current is formed; said differential current forming said selection signal indicating when said first control value or said second control value is to be selected in order to minimize a difference between said reference signal and said control variable;

a first current mirror circuit which is connected between said first differential circuit and said first node in order to pass said first current to said first node; and a second current mirror circuit and a third current mirror circuit which is connected in series with said second current mirror circuit; said second and third current mirror circuits being connected between said second differential circuit and said first node in order to pass said second current to said first node.

2. The electric circuit of claim 1, comprises, for providing said first control value, a first transmission gate being clocked with a first clock signal which has said first period duration.

3. The electric circuit of claim 2, comprising, for providing said second control value, a second transmission gate being clocked with a second clock signal, which has said first period duration and is phase-shifted by half said first period duration relative to said first clock signal.

4. The electric circuit of claim 1, comprising a first capacitor for storing said first control value and a second capacitor for storing said second control value.

5. The electric circuit of claim 1, wherein said first current mirror circuit and said second current mirror circuit are each npn current mirror circuits and said third current mirror circuit is a pnp current mirror circuit.

6. The electric circuit of claim 1, comprising a third capacitor for storing said differential current.

7. The circuit of claim 1, wherein said first differential circuit comprises a first bias transistor and said second differential circuit comprises a second bias transistor, so that an identical reference current is provided for said first and second currents.

8. The electric circuit of claim 1, wherein said control variable, said first control value and said second control value are each a voltage.

* * * * *